(12) United States Patent
Park et al.

(10) Patent No.: US 8,945,993 B2
(45) Date of Patent: Feb. 3, 2015

(54) METHOD OF MANUFACTURING A BALL GRID ARRAY SUBSTRATE OR A SEMICONDUCTOR CHIP PACKAGE

(71) Applicant: Samsung Electro-Mechanics Co., Ltd., Suwon (KR)

(72) Inventors: Jung Hyun Park, Hwaseong (KR); Nam Keun Oh, Daejeon (KR); Sang Duck Kim, Cheongju (KR); Jong Gyu Choi, Yeongi (KR); Young Ji Kim, Daejeon (KR); Ji Eun Kim, Gwangmyeong (KR); Myung Sam Kang, Hwaseong (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 14/028,837

(22) Filed: Sep. 17, 2013

(65) Prior Publication Data
US 2014/0017855 A1     Jan. 16, 2014

Related U.S. Application Data

(62) Division of application No. 12/923,037, filed on Aug. 30, 2010, now Pat. No. 8,546,943.

(30) Foreign Application Priority Data

Oct. 28, 2009     (KR) .......................... 10-2009-0102733

(51) Int. Cl.
*H01L 21/332*     (2006.01)
*H01L 21/768*     (2006.01)
(Continued)

(52) U.S. Cl.
CPC .......... *H01L 21/76885* (2013.01); *H01L 23/13* (2013.01); *H01L 24/97* (2013.01);
(Continued)

(58) Field of Classification Search
CPC ... H01L 23/13; H01L 24/97; H01L 21/02112; H01L 21/76885
USPC .................................................. 438/125, 613
See application file for complete search history.

(56) References Cited

U.S. PATENT DOCUMENTS 6,114,005 A     9/2000  Nagai et al. ................... 428/114
7,669,320 B2    3/2010  Hurwitz et al. ................. 29/846
(Continued)

FOREIGN PATENT DOCUMENTS

JP      2004-47898      2/2004
KR      2002-0085999    11/2002
(Continued)

OTHER PUBLICATIONS

Korean Office Action issued Apr. 27, 2011 in corresponding Korean Patent Application 10-2009-0102733.
(Continued)

*Primary Examiner* — Benjamin Sandvik
*Assistant Examiner* — Farid Khan

(57) ABSTRACT

A method of manufacturing a ball grid array substrate includes: forming a first circuit pattern and a second circuit pattern on a first metal carrier and a second metal carrier, respectively; stacking a first insulating layer and a second insulating layer with a separable material interposed therebetween, wherein each of the first and second insulating layers has first and second surfaces opposing each other, and the first surface contacts the separable material; burying the first and second circuit patterns in the second surfaces of the first and second insulating layers, respectively; removing the first and second metal carriers; removing the separable material to separate the first and second insulating layers from each other; and forming an opening in each of the first and second insulating layers to connect the first and second surfaces with each other. The method may also be part of a process for manufacturing a semiconductor package.

6 Claims, 7 Drawing Sheets

(51) Int. Cl.
*H01L 23/13* (2006.01)
*H01L 23/00* (2006.01)
*H01L 21/02* (2006.01)
*H01L 23/31* (2006.01)

(52) U.S. Cl.
CPC ....... *H01L21/02112* (2013.01); *H01L 23/3128* (2013.01); *H01L 2224/48091* (2013.01); *H01L 2224/4824* (2013.01); *H01L 2224/48465* (2013.01); *H01L 2224/97* (2013.01); *H01L 2924/01029* (2013.01); *H01L 2924/01078* (2013.01); *H01L 24/48* (2013.01); *H01L 2924/01033* (2013.01); *H01L 2924/014* (2013.01); *H01L 2924/15311* (2013.01)
USPC .......................................... 438/125; 438/613

(56) References Cited

U.S. PATENT DOCUMENTS

| | | | |
|---|---|---|---|
| 2002/0149121 A1 | 10/2002 | Shikano et al. | 257/787 |
| 2007/0289127 A1 | 12/2007 | Hurwitz et al. | 29/827 |
| 2009/0011220 A1* | 1/2009 | Park et al. | 428/317.5 |
| 2010/0314755 A1* | 12/2010 | Kang et al. | 257/737 |
| 2011/0186997 A1* | 8/2011 | Hwang et al. | 257/738 |
| 2012/0225521 A1 | 9/2012 | Hwang et al. | 438/106 |

FOREIGN PATENT DOCUMENTS

| KR | 10-057858 | 5/2006 |
|---|---|---|
| KR | 10-2009-0029380 | 3/2009 |

OTHER PUBLICATIONS

Restriction Requirement mailed from the United States Patent and Trademark Office on Mar. 29, 2012 in the related U.S. Appl. No. 12/923,037.

Office Action mailed from the Unites Stated Patent and Trademark Office on Jan. 30, 2013 in the related U.S. Appl. No. 12/923,037.

Notice of Allowance mailed from the United States Patent and Trademark Office on May 28, 2013 in the related U.S. Appl. No. 12/923,037.

U.S. Appl. No. 12/923,037, filed Aug. 30, 2010, Jung Hyun Park et al., Samsung Electro-Mechanics Co, Ltd.

* cited by examiner

METHOD OF MANUFACTURING A BALL GRID ARRAY SUBSTRATE OR A SEMICONDUCTOR CHIP PACKAGE

CROSS-REFERENCE TO RELATED APPLICATIONS

This application is a U.S. divisional application filed under 37 CFR 1.53(b) claiming priority benefit of U.S. Ser. No. 12/923,037 filed in the United States on Aug. 30, 2010, now allowed, which claims earlier foreign priority benefit to Korean Patent Application No. 10-2009-0102733 filed with the Korean Intellectual Property Office on Oct. 28, 2009, the disclosures of which are incorporated herein by reference.

BACKGROUND

1. Field

The present invention relates to a ball grid array substrate, a semiconductor chip package and a method of manufacturing the same, and more particularly, to a ball grid array substrate having an ultra-thin profile and including a high-density circuit pattern, a semiconductor chip package, and a method of manufacturing the same.

2. Description of the Related Art

The recent trend of the electronic industry is to manufacture small, light-weight, multi-functional, high-performance and high-reliability products at low cost. One of important technologies, enabling the realization of such products, is a packaging technology. In this regard, a Chip Scale Package (CSP) has recently been developed. The CSP provides a semiconductor device package miniaturized to a semiconductor chip scale, and has a size of less than about 1.2 times greater than a chip size.

Furthermore, the rapid advancement in the performance of a semiconductor chip requires a packaging substrate to be improved accordingly. The demand for a packaging substrate achieving higher density, higher speed and smaller size is increasing. Moreover, a packaging substrate, allowing for an even system in packaging, is currently in demand.

A flip-chip ball grid array substrate, used as this packaging substrate, is faced with issues such as advanced electric properties, high reliability, a high-speed signal transfer structure, an ultra-thin profile and fine circuit patterns according to the specifications of a semiconductor device.

For example, the technical trend for a flip-chip ball grid array substrate in 2007 suggested that an L/S (Line/Space) representing the critical dimension of a circuit pattern and the interval between circuit patterns be 10 □/10 □, and the thickness of the flip-chip ball grid array substrate be 0.2 mm.

However, the related art flip-chip ball grid array substrate adopts a thick copper clad laminate as a core, which results in an increase in the overall thickness of the flip-chip ball grid array substrate. Consequently, it is difficult to manufacture the flip-chip ball grid array substrate as an ultra-thin plate of 0.2 mm or less.

SUMMARY

An aspect of the present invention provides a ball grid array substrate having an ultra-thin profile and including a high-density circuit pattern, a semiconductor chip package, and a method of manufacturing the same.

According to an aspect of the present invention, there is provided a ball grid array substrate including: an insulating layer having a first surface providing a mounting region for a semiconductor chip, a second surface opposing the first surface, and an opening connecting the second surface with the mounting region of the semiconductor chip; and a circuit pattern buried in the second surface.

The insulating layer may include resin and a reinforcement matrix.

The circuit pattern may include a wire bonding pad and a ball pad.

According to another aspect of the present invention, there is provided a semiconductor chip package including: an insulating layer including a first surface providing a mounting region for a semiconductor chip, a second surface opposing the first surface, and an opening connecting the second surface with the mounting region of the semiconductor chip; a circuit pattern buried in the second surface; a semiconductor chip including at least one bonding pad formed on an active surface, and mounted on the first surface such that the bonding pad is exposed through the opening; and a bonding wire connecting the circuit pattern with the bonding pad.

The circuit pattern may include a wire bonding pad and a ball pad.

A solder ball may be formed on the circuit pattern.

According to another aspect of the present invention, there is provided a method of manufacturing a ball grid array substrate, the method including: forming a first circuit pattern and a second circuit pattern on a first metal carrier and a second metal carrier, respectively; stacking a first insulating layer and a second insulating layer with a separable material interposed therebetween, wherein each of the first insulating layer and the second insulating layer has first and second surfaces opposing each other, and the first surface contacts the separable material; burying the first and second circuit patterns in the second surfaces of the first and second insulating layers, respectively; removing the first and second metal carriers; removing the separable material to separate the first and second insulating layers from each other; and forming an opening in each of the first and second insulating layers to connect the first and second surfaces with each other.

The separable material may be removed by ultraviolet light or heat.

The circuit pattern may include a wire bonding pad and a ball pad.

According to another aspect of the present invention, there is provided a method of manufacturing a semiconductor chip package, the method including: forming a first circuit pattern and a second circuit pattern on a first metal carrier and a second metal carrier, respectively; stacking a first insulating layer and a second insulating layer with a separable material interposed therebetween, wherein each of the first and second insulating layers has first and second surfaces opposing each other, and the first surface contacts the separable material; burying the first and second circuit patterns in the second surfaces of the first and second insulating layers, respectively; removing the first and second metal carriers; removing the separable material to separate the first and second insulating layers from each other; forming an opening in each of the first and second insulating layers to connect the first surface with the second surface; mounting a semiconductor chip, including at least one bonding pad formed on an active surface, on the first surface, such that the bonding pad is exposed through the opening; and connecting the circuit pattern with the bonding pad by using a bonding wire.

The separable material may be removed by ultraviolet light or heat.

The circuit pattern may include a wire bonding pad and a ball pad.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Figure 1A:
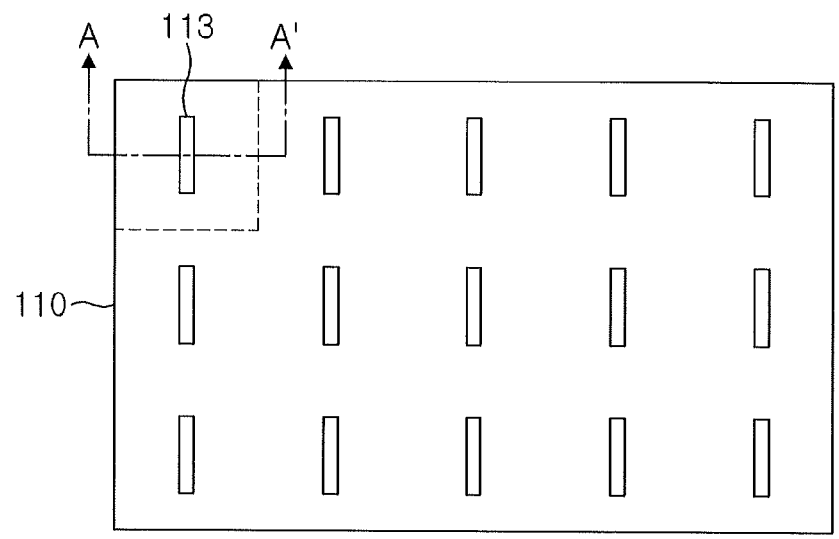
FIG. 1A is a schematic plan view illustrating a ball grid array substrate according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements are exaggerated for clarity. The same or equivalent elements are referred to by the same reference numerals throughout the specification.

Figure 1B:
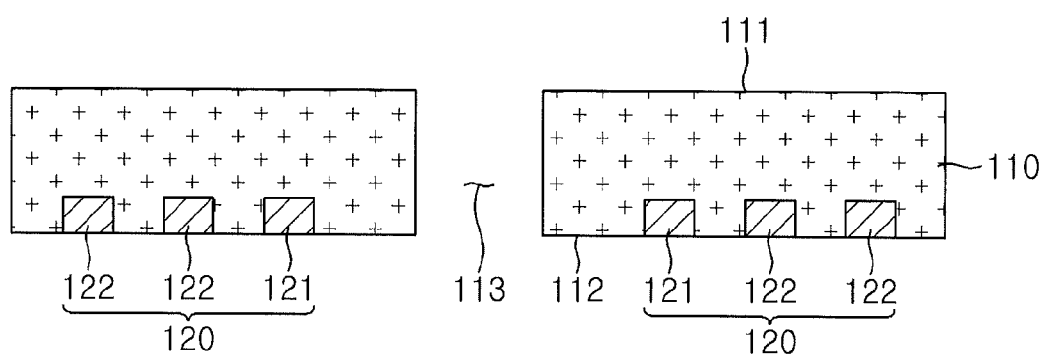
FIG. 1B is a cross-sectional view taken along line A-A' of FIG. 1, illustrating a part of the ball grid array substrate.

FIG. 1A is a schematic plan view illustrating a ball grid array substrate according to an exemplary embodiment of the present invention. FIG. 1B is a cross-sectional view taken along line A-A' of FIG. 1A, illustrating a part of the ball grid array substrate.

Referring to FIGS. 1A and 1B, a ball grid array substrate 100, according to this exemplary embodiment, includes a first surface 111 providing a mounting region for a semiconductor chip, a second surface 112 opposing the first surface 111, an insulating layer having an opening 113 connecting the second surface with the mounting region for the semiconductor chip, and a circuit pattern 20 buried in the second surface 112.

The insulating layer 110, although not limited thereto, may utilize a resin material impregnated with a reinforcement matrix. For example, the insulating layer 110 may be formed of half-hardened prepreg.

The resin, although not limited thereto, may utilize, for example, epoxy resin, polyimide or Bismaleimide Triazine (BT) resin or the like. The reinforcement matrix, although not limited thereto, may utilize glass fiber aramid, paper or the like.

The circuit pattern 120 is buried in the second surface 112 of the insulating layer 110, and includes wire bonding pads 121 connected with a bonding wire, and ball pads 122 on which a solder balls are formed.

A solder resist layer, although not illustrated thereupon, may be formed on the circuit pattern 120.

Figure 2A:
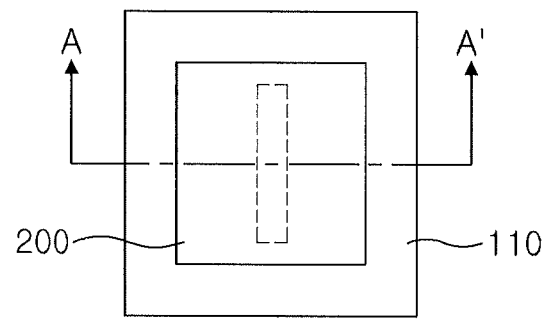
FIG. 2A is a schematic plan view illustrating a semiconductor chip package according to an exemplary embodiment of the present invention.
Figure 2B:
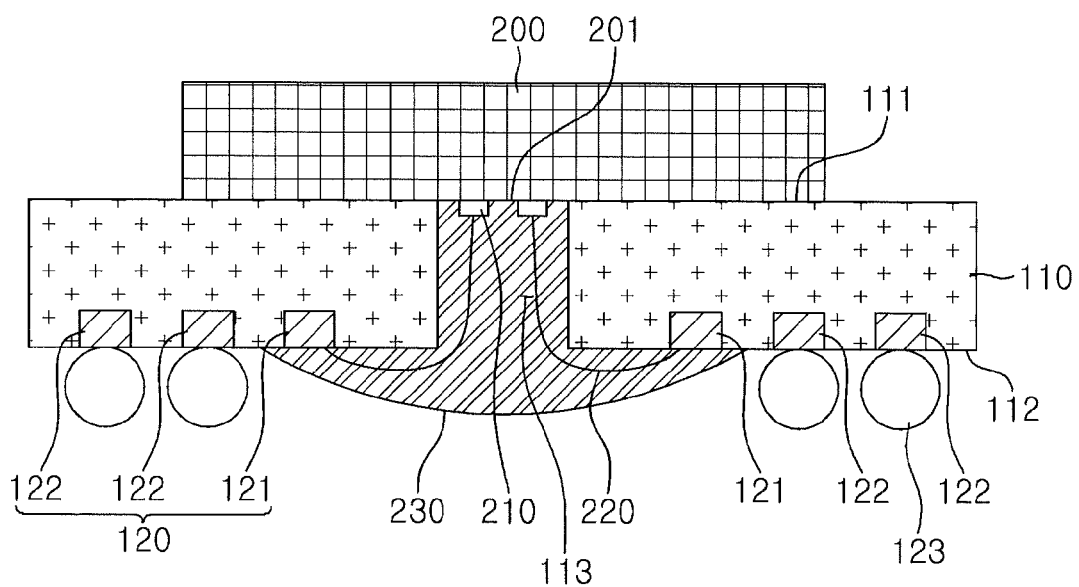
FIG. 2B is a schematic cross-sectional view illustrating a semiconductor chip package according to an exemplary embodiment of the present invention.

FIG. 2A is a schematic plan view illustrating a semiconductor chip package according to an exemplary embodiment of the present invention. FIG. 2B is a schematic cross-sectional view illustrating a semiconductor chip package according to an exemplary embodiment of the present invention.

Referring to FIGS. 2A and 2B, the semiconductor chip package, according to this exemplary embodiment, includes a ball grid array substrate and a semiconductor chip mounted on the ball grid array substrate.

The semiconductor chip package, according to this exemplary embodiment, is a Board On Chip package.

The ball grid array substrate includes the first surface 111 providing a mounting region for a semiconductor chip, the second surface 112 opposing the first surface 111, the insulating layer 110 having an opening 113 connecting the first surface 111 with the second surface 112, and the circuit pattern 120 buried in the second surface.

A semiconductor chip 200 is mounted with its face down on the first surface 111 of the ball grid array substrate. Thus, an active surface 201 of the semiconductor chip 200 faces the ball grid array substrate, and is partially exposed through the opening 113.

Electronic devices and circuits are formed on the active surface 201, and at least one bonding pad 210 is formed on the active surface 201. The bonding pad 210 is exposed through the opening 113 of the ball grid array substrate.

The semiconductor chip 200 is connected to the circuit pattern 120 of the ball grid array substrate by a bonding wire 220. The bonding wire 220 bonds the bonding pad 210 of the semiconductor chip 200, exposed through the opening 113, to the circuit pattern 121 of the ball grid array substrate, thereby providing an electronic connection therebetween.

The semiconductor chip package may include an encapsulant 230 surrounding the bonding wire 220 and filling up the opening 113.

The encapsulant 230 may be formed by dispensing, potting, printing, molding or the like.

The encapsulant 230 may utilize a material capable of protecting a subsequent process and the bonding wire of the semiconductor chip package. The encapsulant 230, although not limited thereto, may utilize epoxy, silicon or the like, for example.

Furthermore, a solder ball 123 may be formed on the ball pad 122 of the ball grid array substrate.

The solder ball 123 provides a connection between the ball grid array substrate with an external circuit such as a system board or the like.

Hereinafter, a method of manufacturing a ball grid array substrate, according to an exemplary embodiment of the present invention, will be described.

FIGS. 3A through 3G are cross-sectional views illustrating a method of manufacturing a ball grid array substrate according to an exemplary embodiment of the present invention.

First, circuit patterns are formed on a first metal carrier 130a and a second metal carrier 130b.

Here, the first and second metal carriers 130a and 130b may be formed of copper and each have a thickness of 12□ or greater.

A method of forming a circuit pattern is not limited to a specific manner, and may adopt a method which is generally used in this technical field.

Figure 3A:
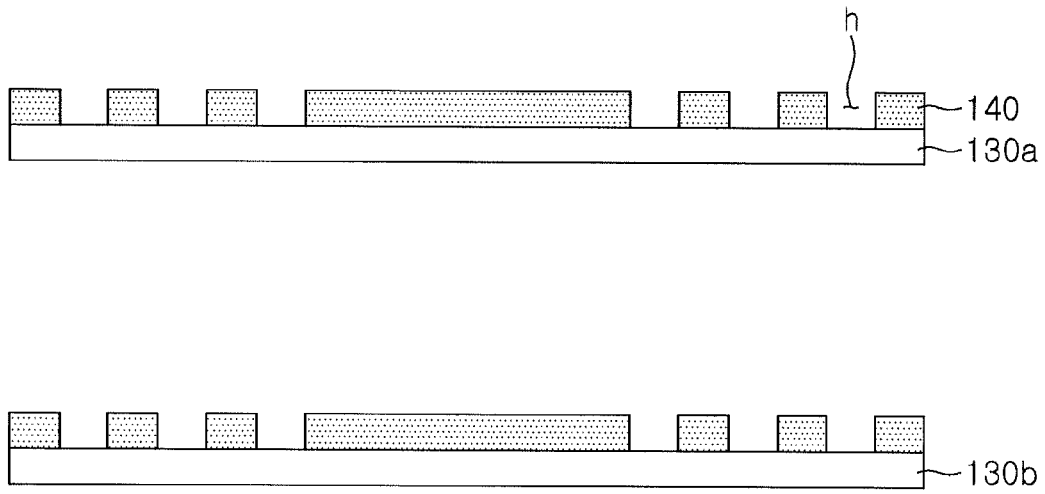
FIGS. 3A through 3G are cross-sectional views illustrating a method of manufacturing a ball grid array substrate according to an exemplary embodiment of the present invention.
Figure 3B:
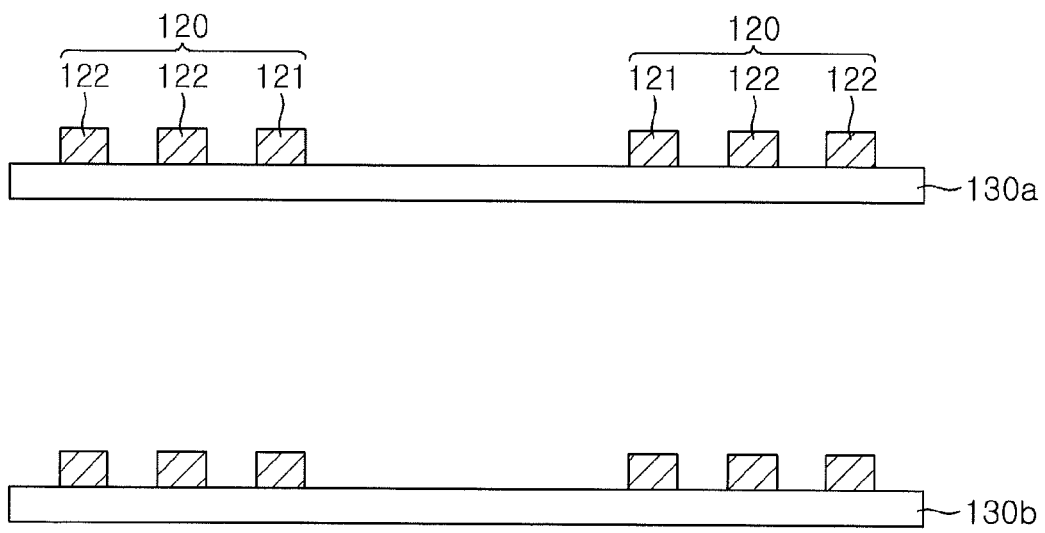

For example, as shown in FIG. 3A, a plating resist layer 140, having openings corresponding to a circuit pattern, is formed on the first metal carrier 130a, and is subjected to exposure, development and electroplating. Before the electroplating process, a seed layer may be formed by electroless plating, and a circuit pattern may be then formed thereon through electroplating. In such a manner, a circuit pattern 120 corresponding to the openings h of the plating resist layer 140 is formed as shown in FIG. 3B.

The circuit pattern 120 may include wire bonding pads 121 and ball pads 122.

The first metal carrier 130a and the second metal carrier 130b may be subjected to the same processes. Therefore, a description is made mainly about the first metal carrier 130a.

Figure 3C:
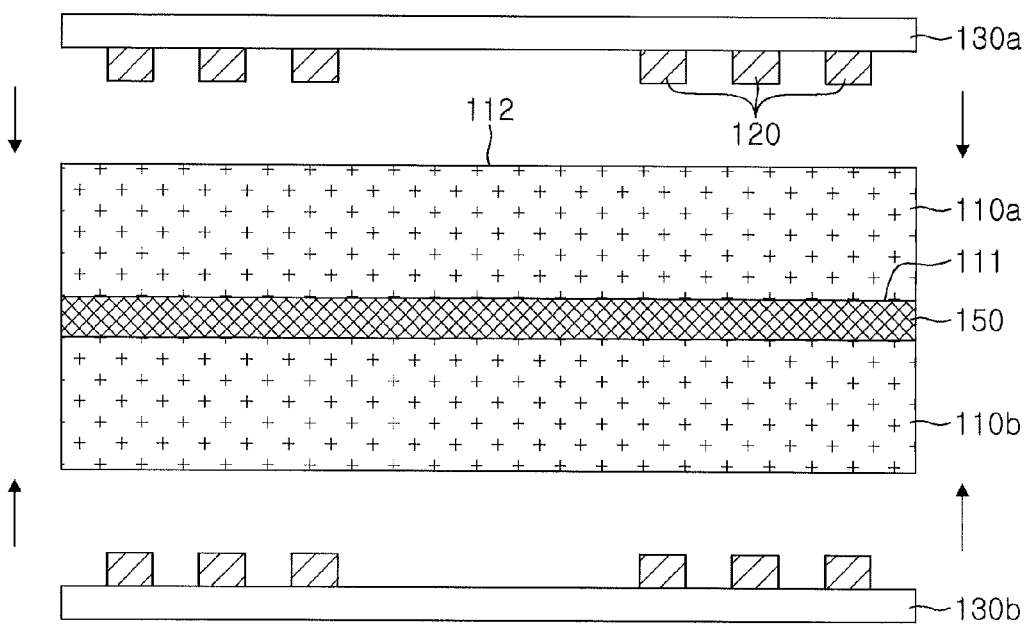

Thereafter, as shown in FIG. 3C, a first insulating layer 110a and a second insulating layer 110b are stacked with a separable material 150 interposed therebetween. The first insulating layer 110a and the second insulating layer 110b each have a first surface 111 and a second surface 112 opposing each other. The first and second insulating layers 110a and 110b are stacked such that the first surfaces 111 thereof contact the separable material 150.

Subsequently, the circuit pattern 120 formed on the first metal carrier 130a is disposed to face the second surface of the first insulating layer 110a, and the circuit pattern formed on the second metal carrier 130b faces the second surface of the second insulating layer 110b. The first and second insulating layers 110a and 110b may be formed of half-hardened prepreg of resin impregnated with a reinforcement matrix.

Figure 3D:
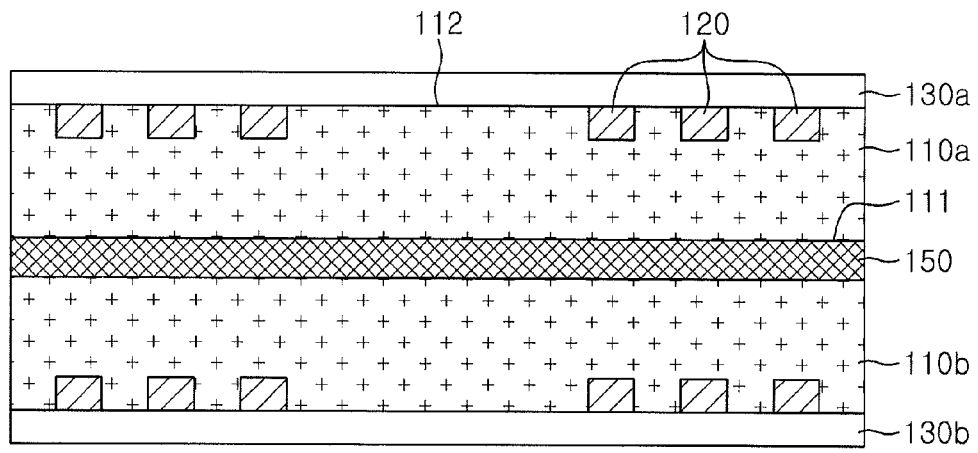

Thereafter, as illustrated in FIG. 3D, the first and second insulating layers 110a and 110b are compressed so that the circuit patterns (hereinafter also "first and second circuit patterns") of the first and second metal carriers 130a and 130b are buried in the first insulating layer 110a and the second insulating layer 110b, respectively.

Figure 3E:
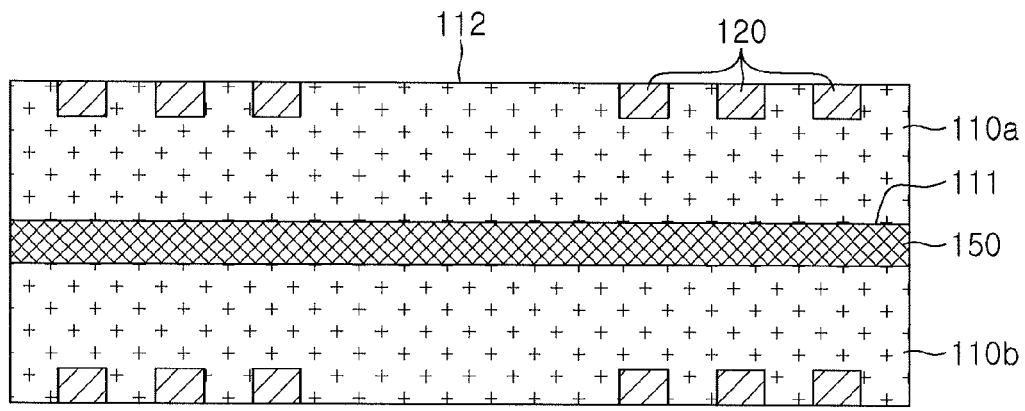

Thereafter, as shown in FIG. 3E, the first metal carrier 130a and the second metal carrier 130b are removed. The removal of the first and second metal carriers 130a and 130b, although not limited thereto, may be performed by a chemical method using etching.

Although not shown, a solder resist layer may be formed on the first circuit pattern 120a and the second circuit pattern 120b.

Figure 3F:
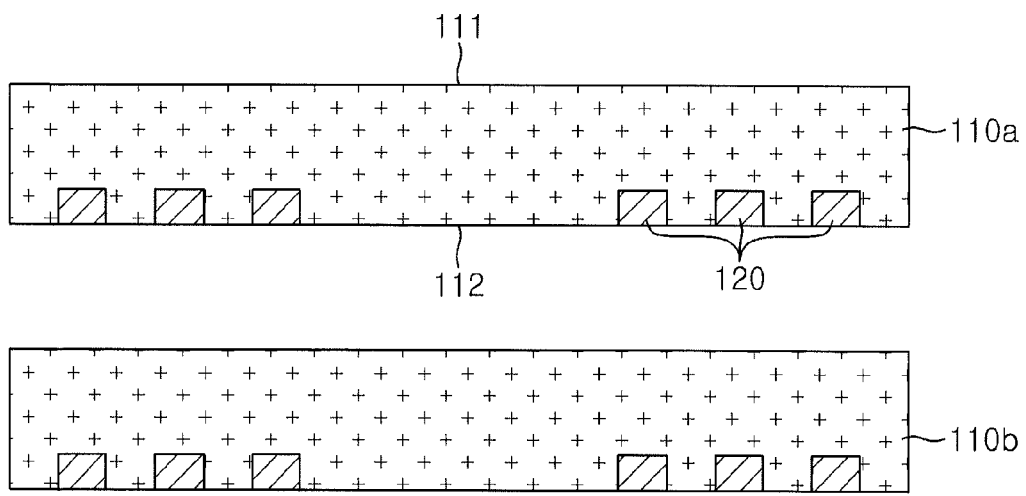

As shown in FIG. 3F, the separable material 150 is removed to thereby separate the first insulating layer 110a from the second insulating layer 110b.

The separable material 150 may utilize a material that has an adhesive force weakened by a predetermined factor. The predetermined factor may be ultraviolet light, heat or the like. The separable material 150, bonded to the first and second insulating layers 110a and 110b, may be easily separated as its adhesive force is weakened by a predetermined factor.

Figure 3G:
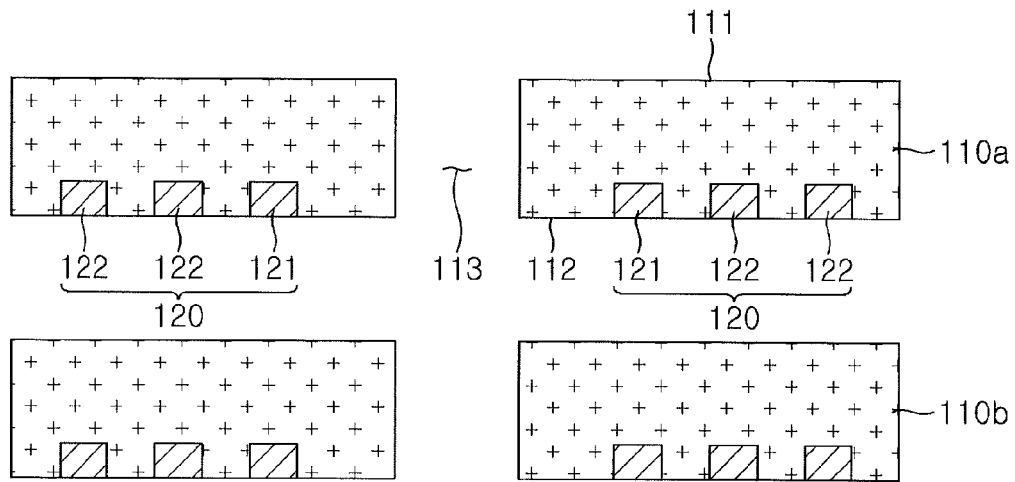

Thereafter, as shown in FIG. 3G, an opening 113 connecting the first and second surfaces 111 and 112 of the first insulating layer 110a is formed.

The forming of the opening 113 may be performed by a laser drilling process or a CNC drilling process; however, it is not limited thereto.

The method of manufacturing the ball grid array substrate, according to this exemplary embodiment, is performed by stacking two insulating layers. Therefore, a predetermined level of thickness or higher is ensured thereby allowing for the use of existing devices and the production of an ultra-thin substrate. Furthermore, two ball grid array substrates are manufactured through a single process, thereby shortening the manufacturing process.

Furthermore, since a circuit pattern is formed on a metal carrier and buried in an insulating layer, a high-density circuit pattern may be formed.

Figure 4A:
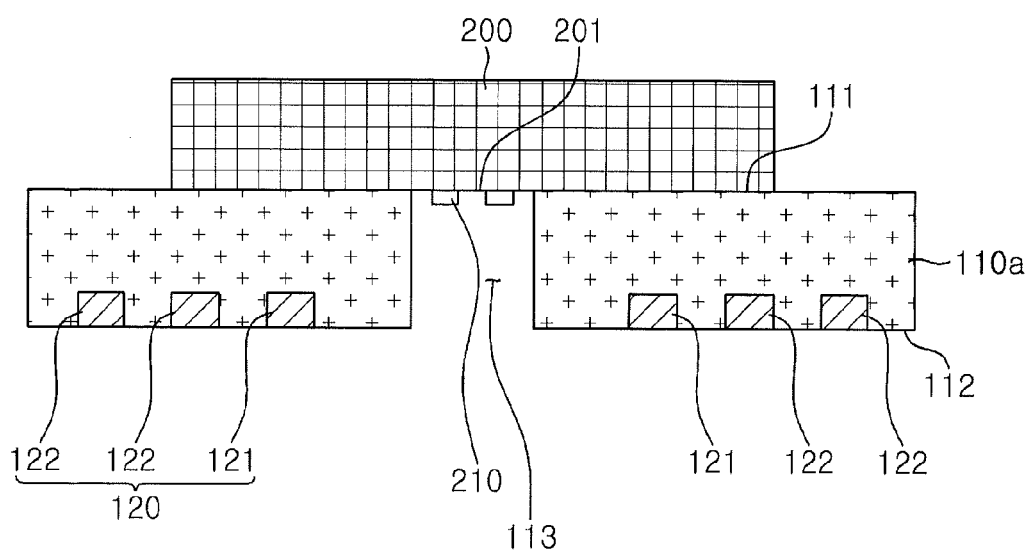
FIGS. 4A through 4C are cross-sectional views illustrating a method of manufacturing a semiconductor chip package according to an exemplary embodiment of the present invention.
Figure 4B:
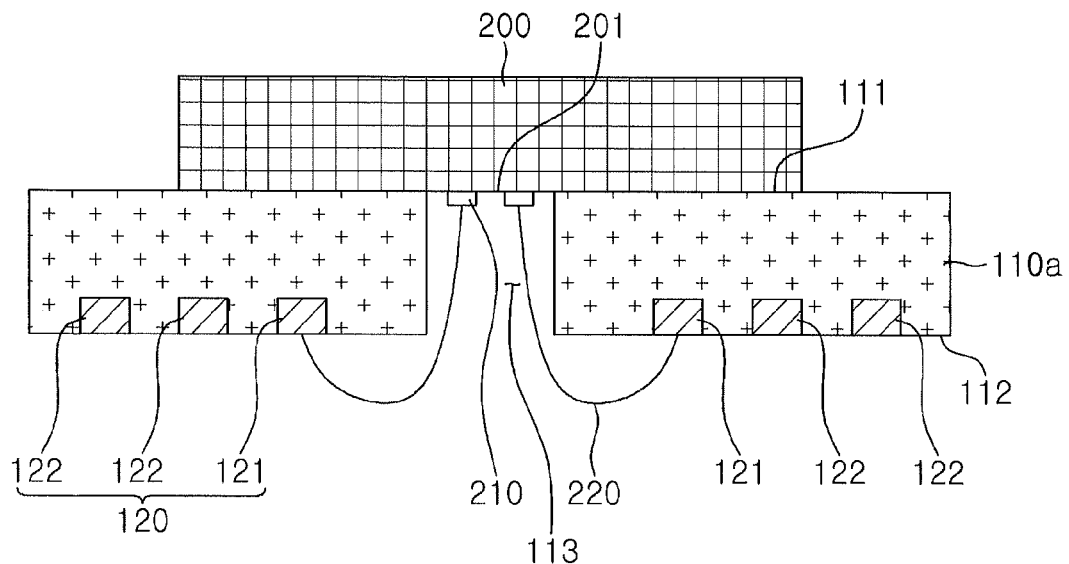
Figure 4C:
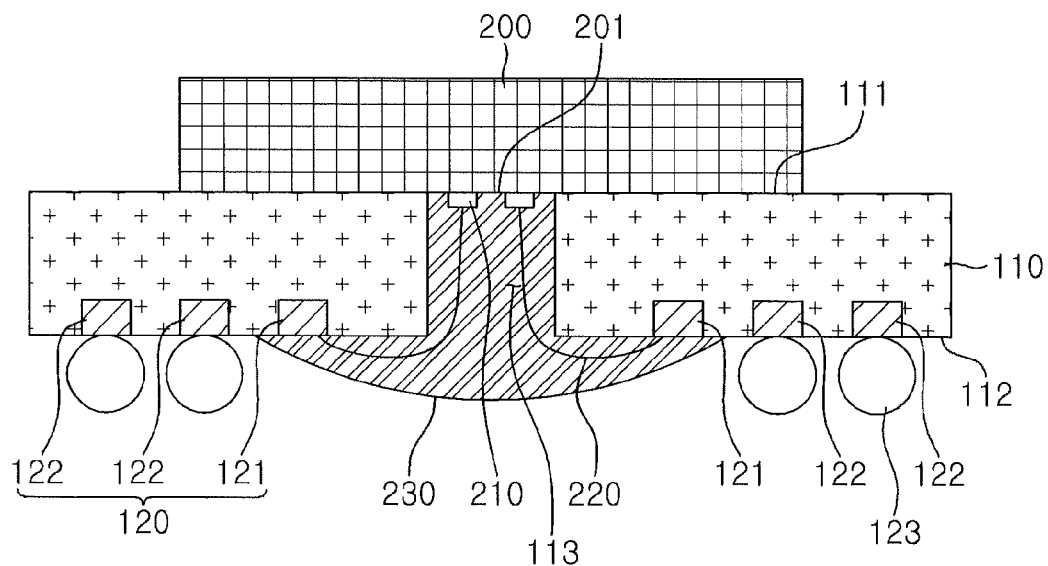

FIGS. 4A through 4C are cross-sectional views illustrating a method of manufacturing a semiconductor chip package according to an exemplary embodiment of the present invention.

Hereinafter, a method of manufacturing a semiconductor chip package according to an exemplary embodiment of the present invention will be described with reference to FIGS. 4A through 4C.

Since the ball grid array substrate, used for the semiconductor chip package, is manufactured in the same manner as in the above-described embodiment, the following description will be made with regard to processes after the manufacturing process described with reference to FIG. 3G.

As shown in FIG. 4A, a semiconductor chip 200 is mounted on the first surface 111 of the ball grid array substrate. The semiconductor chip 200 is mounted with its face down on the ball grid array substrate. That is, an active surface 201 of the semiconductor chip faces the substrate, and is partially exposed through the opening 113. Here, the semiconductor chip 200 is mounted such that the bonding pad 210 on the active surface 201 is exposed through the opening 113 of the ball grid array substrate.

Thereafter, as shown in FIG. 4B, the bonding pad 201 of the semiconductor chip 200 is connected with the circuit pattern 120 of the ball grid array substrate by using a bonding wire 220. Accordingly, the bonding pad 201 of the semiconductor chip 200, exposed through the opening 113, is electrically connected with the circuit pattern 121 of the ball grid array substrate.

Subsequently, as shown in FIG. 4C, the opening 113 is filled with an encapsulant 230 to surround the bonding wire 220. The encapsulant 230 may be formed by dispensing, potting, printing, molding or the like.

Furthermore, a solder ball 123 is formed on the ball pad 122 of the ball gird array substrate. The solder ball 123 may connect the ball grid array substrate with an external circuit such as a system board or the like.

As set forth above, according to exemplary embodiments of the invention, ball grid array substrates are manufactured by stacking two insulating layers. Accordingly, a sufficient level of thickness is ensured, which allows for the use of existing devices and the production of ultra-thin substrates. Since two ball grid array substrates are manufactured through a single process, thereby shortening the manufacturing process. Furthermore, a circuit pattern is buried in the insulating layer, thereby achieving the formation of a high-density circuit pattern.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a ball grid array substrate, the method comprising:
    forming a first circuit pattern and a second circuit pattern on a first metal carrier and a second metal carrier, respectively;
    stacking a first insulating layer and a second insulating layer with a separable material interposed therebetween, wherein each of the first insulating layer and the second insulating layer has first and second surfaces opposing each other, and the first surface contacts the separable material;
    burying the first and second circuit patterns in the second surfaces of the first and second insulating layers, respectively;
    removing the first and second metal carriers;
    removing the separable material to separate the first and second insulating layers from each other; and
    forming an opening in each of the first and second insulating layers to connect the first and second surfaces with each other.

2. The method of claim 1, wherein the separable material is removed by ultraviolet light or heat.

3. The method of claim 1, wherein the circuit pattern comprises a wire bonding pad and a ball pad.

4. A method of manufacturing a semiconductor chip package, the method comprising:
- forming a first circuit pattern and a second circuit pattern on a first metal carrier and a second metal carrier, respectively;
- stacking a first insulating layer and a second insulating layer with a separable material interposed therebetween, wherein each of the first and second insulating layers has first and second surfaces opposing each other, and the first surface contacts the separable material;
- burying the first and second circuit patterns in the second surfaces of the first and second insulating layers, respectively;
- removing the first and second metal carriers;
- removing the separable material to separate the first and second insulating layers from each other;
- forming an opening in each of the first and second insulating layers to connect the first surface with the second surface;
- mounting a semiconductor chip, comprising at least one bonding pad formed on an active surface, on the first surface, such that the bonding pad is exposed through the opening; and
- connecting the circuit pattern with the bonding pad by using a bonding wire.

5. The method of claim 4, wherein the separable material is removed by ultraviolet light or heat.

6. The method of claim 4, wherein the circuit pattern comprises a wire bonding pad and a ball pad.

\* \* \* \* \*